US012656411B2

(12) United States Patent
Deng

(10) Patent No.: US 12,656,411 B2
(45) Date of Patent: Jun. 16, 2026

(54) METHOD FOR LOCATING HIGH-IMPEDANCE GROUND FAULT OF SMART DISTRIBUTION NETWORK WITH TOPOLOGY CHANGE ADAPTATION

(71) Applicant: Changsha University of Science & Technology, Changsha (CN)

(72) Inventor: Feng Deng, Changsha (CN)

(73) Assignee: Changsha University of Science & Technology, Changsha (CN)

( * ) Notice: Subject to any disclaimer, the term of this patent is extended or adjusted under 35 U.S.C. 154(b) by 0 days.

(21) Appl. No.: 19/176,225

(22) Filed: Apr. 11, 2025

(65) Prior Publication Data

US 2025/0321293 A1     Oct. 16, 2025

(30) Foreign Application Priority Data

Apr. 11, 2024    (CN) .......................... 202410434769.8

(51) Int. Cl.
  *G01R 31/52*          (2020.01)
(52) U.S. Cl.
  CPC .................................... *G01R 31/52* (2020.01)
(58) Field of Classification Search
  CPC ............................ G01N 29/4481; G01R 31/52
       (Continued)

(56) References Cited

U.S. PATENT DOCUMENTS 11,789,059 B2 * 10/2023 Naidu .................. G01R 31/085
                                                          324/512
2014/0300370 A1    10/2014 Paolone et al.

FOREIGN PATENT DOCUMENTS

CN        110542833  A    12/2019
CN        113759287  A    12/2021
            (Continued)

OTHER PUBLICATIONS

Shi, S., Lei, A., He, X., Mirsaeidi, S. and Dong, X. (2018), Travelling waves-based fault location scheme for feeders in power distribution network. The Journal of Engineering, 2018: 1326-1329. https://doi.org/10.1049/joe.2018.0161 (Year: 2018).*
            (Continued)

*Primary Examiner* — Andrew Schechter
*Assistant Examiner* — Joshua L Forristall
(74) *Attorney, Agent, or Firm* — OPENPTO US LLC; Yuhao Liang

(57)                ABSTRACT

A method for locating a high-impedance ground fault of a smart distribution network with topology change adaptation includes: acquiring a fault traveling wave sample within a specified time window after a fault occurs, and performing continuous wavelet transform on the fault traveling wave sample to obtain traveling wave full waveform feature information; establishing a graph structure of a power distribution network, obtaining a corresponding adjacency matrix, and obtaining node position and structure encoding information in the graph structure through graph random walk and graph Laplace transform; concatenating the node position, the structure encoding information and the traveling wave full waveform feature information to obtain a node feature, and inputting the node feature and an edge feature into the graph structure to establish a graph sample data set; constructing and training a Graph Transformer model; and calling the trained Graph Transformer model to locate a fault in to-be-detected sample data.

7 Claims, 4 Drawing Sheets

(58) Field of Classification Search
USPC ........................................................ 702/59
See application file for complete search history.

(56) References Cited

FOREIGN PATENT DOCUMENTS

| CN | 115935262 A | * | 4/2023 |
| SE | 8506063 | | 12/1985 |
| WO | 2019232595 A1 | | 12/2019 |

OTHER PUBLICATIONS

K. Chen, J. Hu, Y. Zhang, Z. Yu and J. He, "Fault Location in Power Distribution Systems via Deep Graph Convolutional Networks," in IEEE Journal on Selected Areas in Communications, vol. 38, No. 1, pp. 119-131, Jan. 2020, doi: 10.1109/JSAC.2019.2951964. (Year: 2020).*

X. Dong, J. Wang, S. Shi, B. Wang, B. Dominik and M. Redefern, "Traveling wave based single-phase-to-ground protection method for power distribution system," in CSEE Journal of Power and Energy Systems, vol. 1, No. 2, pp. 75-82, Jun. 2015, doi: 10.17775/CSEEJPES.2015.00022. (Year: 2015).*

Yang Li, et al., High impedance fault detection method based on traveling wave full waveform fault characteristics, 2023 IEEE International Conference on Advanced Power System Automation and Protection (APAP), 2023, pp. 532-536.

Deng Feng, et al., Single-Ended Traveling-Wave-Based Fault Location Algorithm for Hybrid Transmission Line Based on the Full-Waveform, Transactions of China Electrotechnical Society, 2018, pp. 3471-3485, vol. 33 No. 15.

* cited by examiner

METHOD FOR LOCATING HIGH-IMPEDANCE GROUND FAULT OF SMART DISTRIBUTION NETWORK WITH TOPOLOGY CHANGE ADAPTATION

CROSS REFERENCE TO THE RELATED APPLICATIONS

This application is based upon and claims priority to Chinese Patent Application No. 202410434769.8, filed on Apr. 11, 2024, the entire contents of which are incorporated herein by reference.

TECHNICAL FIELD

The present disclosure relates to the technical field of smart distribution networks, and in particular, to a method for locating a high-impedance ground fault of a smart distribution network with topology change adaptation.

BACKGROUND

In the research status of methods for locating high-impedance ground faults around the world, the existing methods for locating the high-impedance ground faults are classified into a steady-state method, a transient-state method, and an artificial intelligence (AI) method based on differences in extracted features and recognition technologies. In the steady-state method, for example, an admittance method or a steady-state power direction method, determines a fault position mainly by calculating information such as a faulty line impedance and power through line parameters and steady-state signals such as a node voltage and current when a fault occurs. A traveling wave method is a typical transient-state method, which uses an initial traveling wave generated at a fault position or a reflected traveling wave signal to determine the fault position. Most AI algorithms train models through fault data obtained in a simulation environment, and classify or regress a system operation status through model learning for simulating a performance rule of a feature quantity in a fault database, to locate a high-impedance ground fault. AI algorithms such as a neural network and a fuzzy theory are applied in the high-impedance ground fault locating field.

Conventional methods for locating the high-impedance ground faults have the following problems:

1. The steady-state method estimates information such as an impedance and a power direction based on voltage and current information of measurement points. However, due to distributed power supplies involved or another reason, a traditional unidirectional radiation network is transformed into a two-terminal or multi-terminal active network. In addition, a smart distribution network operates flexibly. Consequently, distribution of system power flow is complex and the steady-state method is difficult to adapt. Further, voltage and current feature quantities used depend on a system operation status and a fault scenario. The voltage and current feature quantities rapidly decrease with an increase in a transition resistance. When the transition resistance increases to a specific value, it is difficult to accurately extract the feature quantities due to potential transformer (PT), current transformer (CT), and analog-to-digital conversion errors, making it difficult for the steady-state method to accurately locate a fault.

2. As the typical transient-state method, the traveling wave method locates a fault through transient features of a fault traveling wave at a moment of fault occurrence, and has good robustness for a system operation status, a fault type, and a transition resistance. However, high-frequency transient features of a fault traveling wave of a high-impedance fault gradually decrease with an increase in the transition resistance. A transmission speed of the fault traveling wave is close to the speed of light. It is difficult for an existing device to accurately capture wave head information. Therefore, a method based on high-frequency information of the traveling wave or the wave head information is prone to failure. In addition, both single-terminal and two-terminal traveling wave methods require traveling wave acquisition apparatuses to be mounted at many positions in a power distribution network. High investment costs limit algorithm practicability.

3. The AI method is based on simulation data and associates a fault position with sample features through different algorithms. However, algorithm design gives little consideration to topology changes, sparse distribution of signal measurement devices, diversity of high-impedance ground fault scenarios and the like in an actual power distribution network. Therefore, an existing method for locating a high-impedance ground fault based on an AI model has a low generalization capability in dealing with network topology changes and fault scenario changes.

SUMMARY

In view of this, the present disclosure provides a method for locating a high-impedance ground fault of a smart distribution network with topology change adaptation, to resolve at least a problem in the prior art that fault locating based on a node-level classification task has limitations.

To achieve the foregoing objective, the present disclosure adopts the following technical solutions:

A method for locating a high-impedance ground fault of a smart distribution network with topology change adaptation includes the following steps:

S1: acquiring a fault traveling wave sample within a specified time window after a fault occurs, and performing continuous wavelet transform on the fault traveling wave sample to obtain traveling wave full waveform feature information;

S2: establishing a graph structure of a power distribution network with busbars or feeders as nodes and power distribution lines between the busbars or the feeders as edges based on a topology of the power distribution network, obtaining a corresponding adjacency matrix, and obtaining node position and structure encoding information in the graph structure through graph random walk and graph Laplace transform; and concatenating the node position, the structure encoding information and the traveling wave full waveform feature information to obtain a node feature, and inputting the node feature and an edge feature into the graph structure to establish a graph sample data set;

S3: in an offline stage, constructing a Graph Transformer model, and training the Graph Transformer model by locating a high-impedance ground fault through a graph classification task, to obtain a trained Graph Transformer model; and S4: in an online stage, calling the trained Graph Transformer model to locate a fault in to-be-detected sample data.

Preferably, the performing continuous wavelet transform to obtain traveling wave full waveform feature information specifically includes:

performing continuous wavelet transform on acquired traveling wave data to draw a time-frequency waveform of a voltage traveling wave signal, where the time-frequency waveform is a traveling wave full waveform;

inputting the traveling wave full waveform into an autoencoder neural network, where a model of the autoencoder neural network is as follows:

$$\begin{cases} Z = \sigma(W_1 X + b_1) \\ \hat{X} = \sigma(W_2 Z + b_2) \\ L_{MSE} = \dfrac{1}{ab}\sum_{i=1}^{a}\sum_{j=1}^{b}\left(X_{ij} - \hat{X}_{ij}\right)^2 \end{cases} \tag{1}$$

where $\sigma$ represents a sigmoid activation function, $X$ represents an input sample, $\hat{X}$ represents a reconstructed sample, $Z$ represents hidden layer output, $L_{MSE}$ represents a mean square error loss function, $W_1$ and $W_2$ are weight matrices, $b_1$ and $b_2$ are bias terms, $X$ and $\hat{X}$ have dimensions of $a \times b$, and $X_{ij}$ and $\hat{X}_{ij}$ represent elements in an $i^{th}$ row and a $j^{th}$ column of matrices; and extracting hidden layer information $Z$ as the traveling wave full waveform feature information.

Preferably, S2 specifically includes:

obtaining an adjacency matrix $A$ and a degree matrix $D$ of a graph, and calculating a random walk matrix $M$:

$$M = D^{-1}A \tag{2}$$

where each element $M_{ij}$ of the random walk matrix $M$ represents a probability of one step from a node i to a node j in a simple random walk;

summing non-diagonal elements of an m-step random walk matrix to obtain $w_m$:

$$w_m = \sum_i \left(D^{-1}A\right)^m - \overline{w}_m \tag{3}$$

where $\overline{w}_m$ represents obtaining a diagonal of the m-step random walk matrix:

$$\overline{w}_m = \mathrm{diag}\left(\left(D^{-1}A\right)^m\right) \tag{4}$$

$w_m$ and $\overline{w}_m$ contain local position and structure information of the node i, and a value of m is selected based on a topology size of the graph;

calculating a Laplace matrix $L_{sym}$ of the graph based on the adjacency matrix $A$ and the degree matrix $D$:

$$L_{sym} = I - D^{-\frac{1}{2}}AD^{-\frac{1}{2}} \tag{5}$$

where $I$ is an identity matrix;

calculating an eigenvalue $\lambda_k$ of $L_{sym}$ and a corresponding eigenvector $\phi_k$; obtaining non-zero eigenvalues and concatenating eigenvectors corresponding to the non-zero eigenvalues into a matrix $H$, where each row of the matrix $H$ corresponds to a representation of a node in an eigenspace; and capturing global position information of the node;

calculating a gradient $\nabla\phi_k$ of the eigenvector $\phi_k$ as relative position information of the node; and using, as relative structure information, a Boolean value indicating whether two nodes belong to a same substructure, where a cosine similarity of traveling wave full waveform feature information of the two nodes is calculated to determine whether the two nodes belong to the same substructure, and when the similarity is less than a preset threshold, the Boolean value is Flase, or when the similarity is greater than the preset threshold, the Boolean value is True;

performing batch normalization on $w_m$, $\overline{w}_m$, $\phi_k$, $\nabla\phi_k$, and $\lambda_k$, and concatenating the traveling wave full waveform feature information $Z$, $w_m$, $\overline{w}_m$, $\phi_k$, and $\lambda_k$ to obtain a node feature x containing the node position, the structure information and the traveling wave full waveform feature information;

concatenating $\nabla\phi_k$, the relative structure information, and edge feature information to obtain an edge feature e; and inputting the node feature and the edge feature into the graph to establish the graph sample data set; and setting a traveling wave full waveform feature of the busbar or the feeder without a measurement device to 0, and concatenating $w_m$, $\overline{w}_m$, $\phi_k$, and $\lambda_k$ corresponding to a case of no measurement device to obtain a node feature of the feeder without the measurement device.

Preferably, the constructing a Graph Transformer model in S3 specifically includes:

constructing an upstream information processing part and a downstream graph classification task part as the Graph Transformer model.

The upstream information processing part includes f Graph Transformer layers connected in sequence. Each Graph Transformer layer includes a graph neural network with a residual gated graph convolutional network layer as a main structure and a Transformer attention mechanism module.

The downstream graph classification task part is used to read node feature and edge feature information through averaging. A unified graph representation $T_i$ is obtained through concatenating. Probabilities that the graph representation $T_i$ belongs to each class are calculated. A sum of the probabilities is 1. The class with the highest probability is output as the class of the graph representation $T_i$.

Preferably, the graph neural network with the residual gated graph convolutional network layer as the main structure specifically includes:

using, as input of the graph neural network at the $(l+1)^{th}$ layer, a node feature and an edge feature output by the $l^{th}$ Graph Transformer layer:

$$\begin{cases} x_i^{l+1} = \mathrm{ReLU}\left(BN\left(U^l x_i^l + \sum_{j \to i} \eta_{ij} \odot V^l x_j^l M_{ultihead}\left(x_j^l\right)\right)\right) + M_{ultihead}\left(x_i^l\right)x_i^l \\ e_{ij}^{l+1} = \mathrm{ReLU}\left(BN(\overline{\eta}_{ij})\right) + e_{ij}^l \end{cases} \tag{6}$$

$$\begin{cases} \eta_{ij} = \sigma\left(A^l x_i^l + B^l x_j^l\right) \\ \overline{\eta}_{ij} = X^l x_i^l + Y^l x_j^l + Z^l e_{ij}^l \end{cases} \tag{7}$$

ReLU represents a rectified linear unit (ReLU) activation function. BN represents batch normalization.

$$x_i^l \text{ and } x_i^{l+1} \qquad 5$$

respectively represent node features of the node i at the $l^{th}$ and $(l+1)^{th}$ layers.

$$e_{ij}^l \text{ and } e_{ij}^{l+1}$$

respectively represent features between the node i and the node j at the $l^{th}$ and $(l+1)^{th}$ layers.

$$M_{ultihead}\left(x_j^l\right)$$

represents an attention weight of the node j to the node i.

$$M_{ultihead}(x_i^l) \qquad 25$$

represents a self-attention weight of the node i.

$$M_{ultihead}\left(x_j^l\right) \text{ and } M_{ultihead}\left(x_i^l\right)$$

are calculated by the Transformer attention mechanism module. $U^l$ and $V^l$ are weight parameters to be learned at the $l^{th}$ layer. $\odot$ represents a Hadamard product operation. $j \to i$ represents the adjacent node j of the node i. $\eta_{ij}$ and $\bar{\eta}_{ij}$ are gating mechanisms for updating the node feature and the edge feature, to control feature propagation among the nodes and edges. $\sigma$ represents the sigmoid activation function.

$$x_j^l$$

represents a node feature of the node j. $X^l$, $Y^l$, $Z^l$, $A^l$, and $B^l$ are weight parameters to be learned at the $l^{th}$ layer.

Preferably, the Transformer attention mechanism module specifically includes a multi-head self-attention structure and a feedforward neural network.

In the multi-head self-attention structure, with each node feature $x_i$ as a row, all node features are sequentially arranged to form an input eigenmatrix X. Three different linear transformations are performed on X to respectively obtain a query matrix Q, a key matrix K, and a value matrix V:

$$\begin{cases} Q = XW_Q \\ K = XW_K \\ V = XW_V \end{cases} \qquad (8)$$

$W_Q$, $W_K$, and $W_V$ are linear transformation matrices. Elements of the linear transformation matrices are determined through training and learning.

A single-head attention $h_{eadi}$ and a final attention output $M_{ultihead}(X)$ are calculated based on Q, K, and V:

6

$$\begin{cases} h_{eadi} = Attn(X) = softmax\left(\dfrac{QK^T}{\sqrt{d_K}} + B\right)V \\ M_{ultihead}(X) = C_{oncat}(h_{ead1}, h_{ead2}, \ldots, h_{eadi})W \end{cases} \qquad (9)$$

$d_K$ represents a quantity of columns in the matrices Q and K. $C_{oncat}(\bullet)$ represents a concatenation function. W is a weight matrix obtained through training and learning. B is a bias term matrix obtained through learning.

After calculation through formula (9), residual connection and layer normalization are performed on output of the multi-head self-attention structure to output X', which is input into the feedforward neural network.

The feedforward neural network includes two fully connected layers, each of which linearly maps an input vector. A hidden layer in the middle is activated through an ReLU function. The feedforward neural network is as follows:

$$F_{FN}(X') = \max(0, X'W_3 + b_3)W_4 + b_4 \qquad (10)$$

$W_3$ and $W_4$ are weight matrices. $b_3$ and $b_4$ are bias terms.

Residual connection and layer normalization are performed on output of the feedforward neural network. The layer normalization specifically includes:

$$\begin{cases} \mu = \dfrac{1}{T}\sum_{i=1}^{T} X_i \\ S = \sqrt{\dfrac{1}{T}\sum_{i=1}^{T}(X_i - \mu)^2} \\ L_N(x) = \alpha \dfrac{x - \mu}{\sqrt{\sigma^2 + \varepsilon}} + \beta \end{cases} \qquad (11)$$

T represents a dimension of an eigenvector $X_i$. $\mu$ represents a mean. S represents a standard deviation. $X_i$ represents the $i^{th}$ dimension of the input eigenvector. $\alpha$ and $\beta$ are learnable model parameters updated through back propagation. $\varepsilon$ is a decimal for preventing a divisor from being 0.

An output matrix $X_{output}$ of the Transformer attention mechanism module is calculated through a layer normalization operation and $F_{FN}(X')$:

$$\begin{cases} X' = L_N(M_{ultihead}(X)) + X \\ X_{output} = L_N(F_{FN}(X')) + X' \end{cases} \qquad (12)$$

$L_N$ represents the layer normalization operation.

Preferably, the downstream graph classification task part is specifically as follows:

$$\begin{cases} r_{ix} = \dfrac{1}{N_i}\sum_{p=1}^{N_i} x_p \\ r_{ie} = \dfrac{1}{M_i}\sum_{q=1}^{M_i} e_q \\ T_i = \begin{bmatrix} r_{ix} \\ r_{ie} \end{bmatrix} \end{cases} \qquad (13)$$

$N_i$ and $M_i$ respectively represent quantities of nodes and edges of a graph $T_i$. $T_i$ is an $i^{th}$ graph representation in the data set. $r_{ix}$ and $r_{ie}$ respectively represent node and edge feature information read from the graph $T_i$. p represents a $p^{th}$ node. q represents a $q^{th}$ edge. A loss function of the model is as follows:

$$Loss = -\frac{1}{N}\sum_{i=1}^{N}\sum_{e=1}^{E} y_{i,e}\log(p_{i,e}) \qquad (14)$$

N represents a quantity of samples. E represents a quantity of classes. $y_{i,e}$ represents a true label of the $e^{th}$ class of the $i^{th}$ sample. $p_{i,e}$ represents a probability predicted by the model for the $e^{th}$ class of the $i^{th}$ sample.

Preferably, S4 specifically includes:

calling the Graph Transformer model trained offline, performing continuous wavelet transform on a to-be-detected fault traveling wave sample to obtain traveling wave full waveform feature information, establishing a graph structure for a to-be-detected power distribution network to obtain node position and structure encoding information, concatenating the traveling wave full waveform feature information, the node position and the structure encoding information to obtain a corresponding node feature, inputting the obtained node feature and the edge feature into the graph structure to establish the graph sample data set corresponding to the to-be-detected fault traveling wave sample, inputting the graph sample data set into the trained Graph Transformer model for classification, and determining a high-impedance ground fault position based on a class of the graph.

It can be learned from the foregoing technical solution that in comparison with the prior art, the method for locating a high-impedance ground fault of a smart distribution network with topology change adaptation provided by the present disclosure has the following beneficial effects:

1. In the present disclosure, time-frequency processing is performed on fault traveling wave data within the selected time window through continuous wavelet transform to obtain the traveling wave full waveform containing rich fault feature information. This effectively avoids a problem that a conventional steady-state method is difficult to use due to a system operation mode and a high transition resistance, and resolves a problem that a traveling wave method based on transient information depends on high-precision wave head information. In addition, abstract features are extracted from the full waveform through an autoencoder, to reduce data dimensions, effectively reduce data storage and calculation costs, and improve adaptability of the method to actual fault conditions of a power distribution network.

2. The present disclosure proposes the Graph Transformer high-impedance ground fault locating model combining the graph neural network with the Transformer global attention mechanism. The model implements fault locating by mining an association relationship between time-frequency fault features of the full waveform, network topology information, and the fault position, and has strong adaptability to topology changes and different fault scenarios. The Transformer global attention mechanism is introduced to avoid a conventional graph neural network's limitation that only adjacent nodes are considered, and effectively combine sparsity of actual measurement point distribution.

3. To resolve a problem of loss of graph structure information and node position information due to the combination of the graph neural network and the Transformer global attention mechanism, the present disclosure proposes a coding scheme based on graph random walk and graph Laplace transform, which enhances the model's ability to express graph structure and node position information from three perspectives: local, global, and relative. Finally, the fault position is determined based on a graph-level classification task, to avoid a limitation of an existing method for locating a fault based on a node-level classification task, effectively utilize fault information of all measurement points, and improve fault locating accuracy.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

Figure 1:
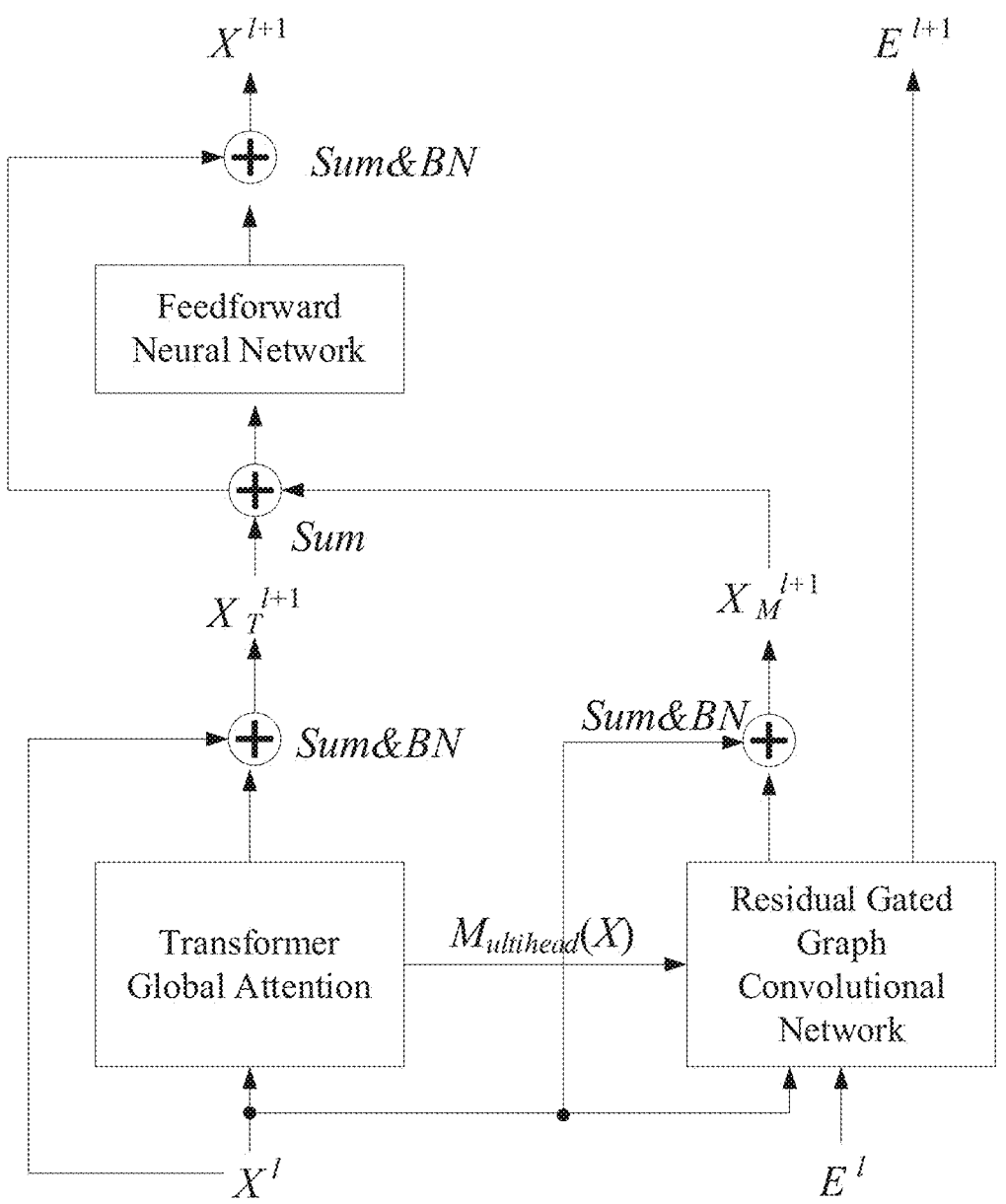
FIG. 1 is a structural diagram of a Graph Transformer layer according to the present disclosure.

The technical solutions in the embodiments of the present disclosure are described clearly and completely below with reference to the accompanying drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts shall fall within the protection scope of the present disclosure.

The present disclosure provides a method for locating a high-impedance ground fault of a smart distribution network with topology change adaptation, including the following steps:

S1: A fault traveling wave sample within a specified time window after a fault occurs is acquired. Continuous wavelet transform is performed on the fault traveling wave sample to obtain traveling wave full waveform feature information.

S2: A graph structure of a power distribution network is established with busbars or feeders as nodes and power distribution lines between the busbars or the feeders as edges based on a topology of the power distribution network. A corresponding adjacency matrix is obtained. Node position and structure encoding information in the graph structure is obtained through graph random walk and graph Laplace transform. The node position, the structure encoding information and the traveling wave full waveform feature information are concatenated to obtain a node feature. The node feature and an edge feature are input into the graph structure to establish a graph sample data set.

S3: In an offline stage, a Graph Transformer model is constructed and trained by locating a high-impedance ground fault through a graph classification task to obtain a trained Graph Transformer model.

S4: In an online stage, the trained Graph Transformer model is called to locate a fault in to-be-detected sample data.

To further implement the foregoing technical solution, that continuous wavelet transform is performed to obtain the traveling wave full waveform feature information specifically includes:

Continuous wavelet transform is performed on acquired traveling wave data to draw a time-frequency waveform of a voltage traveling wave signal. The time-frequency waveform is a traveling wave full waveform.

The traveling wave full waveform is input into an autoencoder neural network. A model of the autoencoder neural network is as follows:

$$\begin{cases} Z = \sigma(W_1 X + b_1) \\ \hat{X} = \sigma(W_2 Z + b_2) \\ L_{MSE} = \frac{1}{ab}\sum_{i=1}^{a}\sum_{j=1}^{b}\left(X_{ij} - \hat{X}_{ij}\right)^2 \end{cases} \tag{1}$$

$\sigma$ represents a sigmoid activation function. X represents an input sample. $\hat{X}$ represents a reconstructed sample. Z represents hidden layer output. $L_{MSE}$ represents a mean square error loss function. $W_1$ and $W_2$ are weight matrices. $b_1$ and $b_2$ are bias terms. X and $\hat{X}$ have dimensions of a×b. $X_{ij}$ and $\hat{X}_{ij}$ represent elements in an $i^{th}$ row and a $j^{th}$ column of matrices.

Hidden layer information Z is extracted as the traveling wave full waveform feature information.

It should be noted that:

In this embodiment, fault traveling wave data within a time window of 100 μs after the fault is acquired, and may be adjusted as needed in an actual working process.

An autoencoder in this embodiment updates parameters in a network through an Adam optimizer. A learning rate $l_r$ is set to 0.001.

To further implement the foregoing technical solution, S2 specifically includes:

An adjacency matrix A and a degree matrix D of a graph are obtained, and a random walk matrix M is calculated:

$$M = D^{-1}A \tag{2}$$

Each element $M_{ij}$ of the random walk matrix M represents a probability of one step from a node i to a node j in a simple random walk.

Non-diagonal elements of an m-step random walk matrix are summed to obtain $w_m$:

$$w_m = \sum_i (D^{-1}A)^m - \overline{w}_m \tag{3}$$

$\overline{w}_m$ represents obtaining a diagonal of the m-step random walk matrix:

$$\overline{w}_m = \text{diag}((D^{-1}A)^m) \tag{4}$$

$w_m$ and $\overline{w}_m$ contain local position and structure information of the node i. A value of m is selected based on a topology size of the graph.

A Laplace matrix $L_{sym}$ of the graph is calculated based on the adjacency matrix A and the degree matrix D:

$$L_{sym} = I - D^{-\frac{1}{2}}AD^{-\frac{1}{2}} \tag{5}$$

I is an identity matrix.

An eigenvalue $\lambda_k$ of $L_{sym}$ and a corresponding eigenvector $\phi_k$ are calculated. Non-zero eigenvalues are obtained, and eigenvectors corresponding to the non-zero eigenvalues are concatenated into a matrix H. Each row of the matrix H corresponds to a representation of a node in an eigenspace. Global position information of the node is captured.

A gradient $\nabla\phi_k$ of the eigenvector $\phi_k$ is calculated as relative position information of the node. A Boolean value indicating whether two nodes belong to a same substructure is used as relative structure information. A cosine similarity of traveling wave full waveform feature information of the two nodes is calculated to determine whether the two nodes belong to the same substructure. When the similarity is less than a preset threshold, the Boolean value is Flase. When the similarity is greater than the preset threshold, the Boolean value is True.

Batch normalization is performed on $w_m$, $\overline{w}_m$, $\phi_k$, $\nabla\phi_k$, and $\lambda_k$. The traveling wave full waveform feature information Z, $w_m$, $\overline{w}_m$, $\phi_k$, and $\lambda_k$ are concatenated to obtain a node feature x containing the node position, the structure information and the traveling wave full waveform feature information.

$\nabla\phi_k$, the relative structure information, and edge feature information are concatenated to obtain an edge feature e.

The node feature and the edge feature are input into the graph to establish the graph sample data set. A traveling wave full waveform feature of the busbar or the feeder without a measurement device is set to 0. $w_m$, $\overline{w}_m$, $\phi_k$, and $\lambda_k$ corresponding to a case of no measurement device are concatenated to obtain a node feature of the feeder without the measurement device.

It should be noted that:

$w_m$ and $\overline{w}_m$ contain the local position and structure information of the node. A value of m needs to be selected based on the topology size of the graph. A larger value of m indicates larger local coverage. Generally, half of the longest path is selected.

The eigenvalue $\lambda_k$ of the matrix $L_{sym}$ contains global structure information such as connectivity and separability of the graph. $\lambda_k=0$ indicates that the graph is connected. If $\lambda_k$ is a non-zero value, it may be used to measure the separability of the graph, namely a relative isolation degree of different parts in the graph.

In a node without a measurement device, full feature information is 0 because there is no traveling wave signal. However, topology information such as position information and structure information of the node without a measurement device in the network can still help determine a fault position. After node update at each Graph Transformer layer, the feature becomes non-zero. Essentially, a feature is supplemented through training. This part of information is also included in a final graph classification task. If the node without a measurement device is not considered, a graph structure and a power distribution network structure do not match, resulting in loss of the topology information, especially when a traveling wave depends heavily on the topology information. This is also a defect of a conventional graph neural network that considers only features of neighboring nodes and a method for locating a fault through node classification. A global attention of Transformer can assist a node without a signal through information about a node with a fault signal.

In this embodiment, the preset threshold is set to 0.8. In actual use, the value is set as needed.

To further implement the foregoing technical solution, that the Graph Transformer model is constructed in S3 specifically includes:

An upstream information processing part and a downstream graph classification task part are constructed as the Graph Transformer model.

The upstream information processing part includes f Graph Transformer layers connected in sequence. As shown in FIG. 1, each Graph Transformer layer includes a graph neural network with a residual gated graph convolutional network layer as a main structure and a Transformer attention mechanism module.

The downstream graph classification task part is used to read node feature and edge feature information through averaging. A unified graph representation $T_i$ is obtained through concatenating. Probabilities that the graph representation $T_i$ belongs to each class are calculated. A sum of the probabilities is 1. The class with the highest probability is output as the class of the graph representation $T_i$.

It should be noted that:

In this embodiment, the probabilities that the graph representation $T_i$ belongs to each class are calculated through softmax.

To further implement the foregoing technical solution, the graph neural network with the residual gated graph convolutional network layer as the main structure specifically includes:

A node feature and an edge feature output by the $l^{th}$ Graph Transformer layer are used as input of the graph neural network at the $(l+1)^{th}$ layer:

$$\begin{cases} x_i^{l+1} = ReLU\left(BN\left(U^l x_i^l + \sum_{j\to i} \eta_{ij} \odot V^l x_j^l M_{ultihead}(x_j^l)\right)\right) + M_{ultihead}(x_i^l) x_i^l \quad (6) \\ e_{ij}^{l+1} = ReLU(BN(\overline{\eta}_{ij})) + e_{ij}^l \end{cases}$$

$$\begin{cases} \eta_{ij} = \sigma(A^l x_i^l + B^l x_j^l) \\ \overline{\eta}_{ij} = X^l x_i^l + Y^l x_j^l + Z^l e_{ij}^l \end{cases} \quad (7)$$

ReLU represents an ReLU activation function. BN represents bath normalization.

$$x_i^l \text{ and } x_i^{l+1}$$

respectively represent node features of the node i at the $l^{th}$ and $(l+1)^{th}$ layers.

$$e_{ij}^l \text{ and } e_{ij}^{l+1}$$

respectively represent edge features between the node i and the node j at the $l^{th}$ and $(l+1)^{th}$ layers.

$$M_{ultihead}(x_j^l)$$

represents an attnetion weight of the node j to the node i.

$$M_{ultihead}(x_i^l)$$

represents a self-attention weight of the node i.

$$M_{ultihead}(x_j^l) \text{ and } M_{ultihead}(x_i^l)$$

are calculated by the Transformer attention mechanism module. $U^l$ and $V^l$ are weight parameters to be learned at the $l^{th}$ layer. $\odot$ represents a Hadamard product operation. $j \to i$ represents the adjacent node j of the node i. $\eta_{ij}$ and $\overline{\eta}_{ij}$ are gating mechanisms for updating the node feature and the edge feature to control feature propagation among the nodes and edges, to better adapt to a complex relationship between different graph structures and features and improve a representation capability and generalization capability of the model. $\sigma$ represents the sigmoid activation function $$x_j^l$$

represents a node feature of the node j. $X^l$, $Y^l$, $Z^l$, $A^l$, and $B^l$ are weight parameters to be learned at the $l^{th}$ layer.

Figure 2:
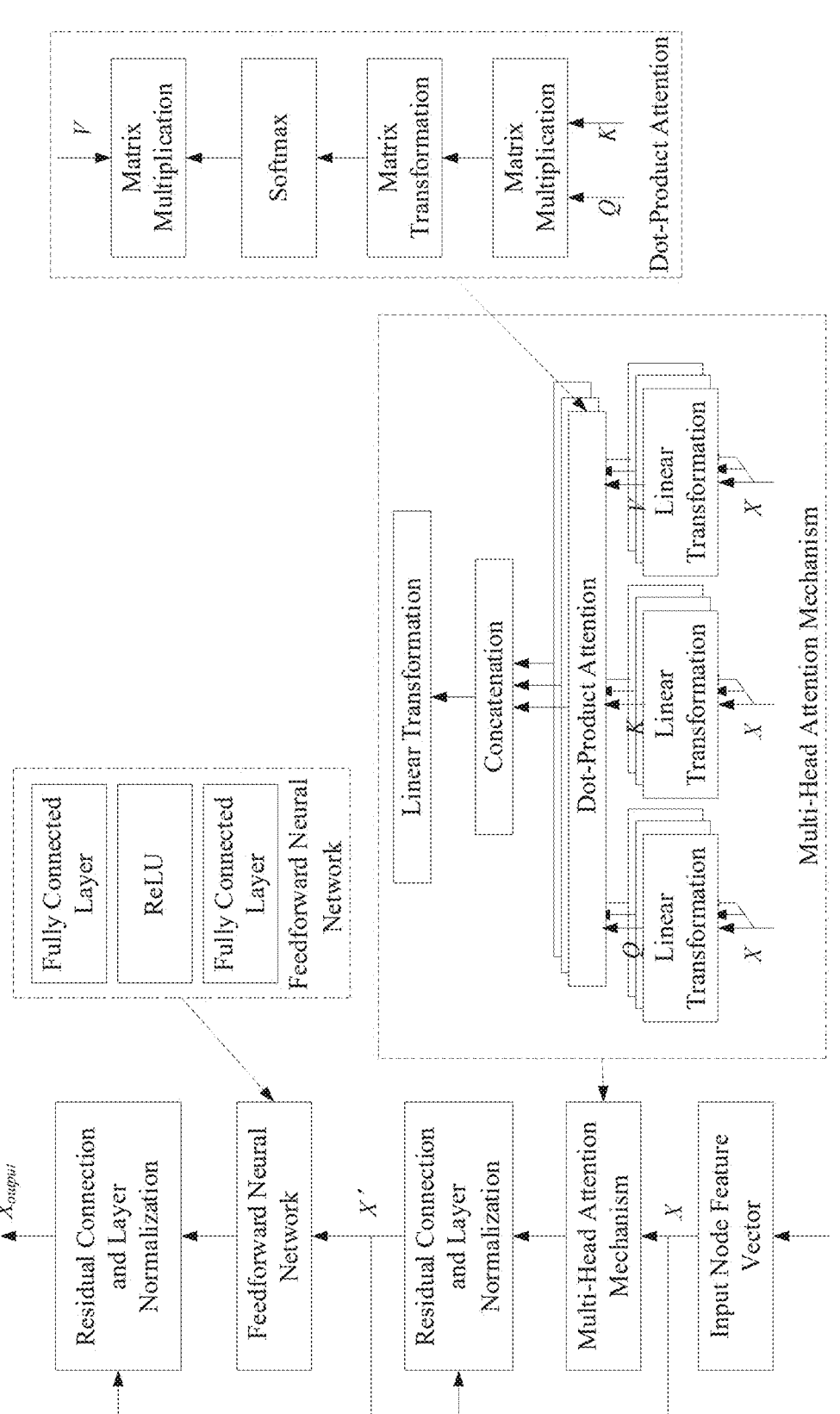
FIG. 2 is a structural diagram of a Transformer attention mechanism module according to the present disclosure.

To further implement the foregoing technical solution, as shown in FIG. 2, the Transformer attention mechanism module specifically includes a multi-head self-attention structure and a feedforward neural network.

In the multi-head self-attention structure, with each node feature $x_i$ as a row, all node features are sequentially arranged to form an input eigenmatrix X. Three different linear transformations are performed on X to respectively obtain a query matrix Q, a key matrix K, and a value matrix V:

$$\begin{cases} Q = XW_Q \\ K = XW_K \\ V = XW_V \end{cases} \quad (8)$$

$W_Q$, $W_K$, and $W_V$ are linear transformation matrices. Elements of the linear transformation matrices are determined through training and learning.

A single-head attention $h_{eadi}$ and a final attention output $M_{ultihead}(X)$ are calculated based on Q, K, and V:

$$\begin{cases} h_{eadi} & = Attn\,(X) = \text{softmax}\left(\dfrac{QK^T}{\sqrt{d_K}} + B\right)V \\ M_{ultihead}(X) & = C_{oncat}(h_{ead1}, h_{ead2}, \cdots, h_{eadi})\,W \end{cases} \tag{9}$$

$d_K$ represents a quantity of columns in the matrices Q and K. $C_{oncat}(\bullet)$ represents a concatenation function. W is a weight matrix obtained through training and learning. B is a bias term matrix obtained through learning.

After calculation through formula (9), residual connection and layer normalization are performed on output of the multi-head self-attention structure to output X', which is input into the feedforward neural network.

The feedforward neural network includes two fully connected layers, each of which linearly maps an input vector. A hidden layer in the middle is activated through an ReLU function. The feedforward neural network is as follows:

$$F_{FN}(X') = \max\,(0, X'W_3 + b_3)W_4 + b_4 \tag{10}$$

$W_3$ and $W_4$ are weight matrices. $b_3$ and $b_4$ are bias terms.

Residual connection and layer normalization are performed on output of the feedforward neural network. The layer normalization specifically includes:

$$\begin{cases} \mu & = \dfrac{1}{T}\sum_{i=1}^{T} X_i \\ S & = \sqrt{\dfrac{1}{T}\sum_{i=1}^{T}(X_i - \mu)^2} \\ L_N(x) & = \alpha\dfrac{x - \mu}{\sqrt{\sigma^2 + \varepsilon}} + \beta \end{cases} \tag{11}$$

T represents a dimension of an eigenvector $X_i$. $\mu$ represents a mean. S represents a standard deviation. $X_i$ represents the $i^{th}$ dimension of the input eigenvector. $\alpha$ and $\beta$ are learnable model parameters updated through back propagation. $\varepsilon$ is a decimal for preventing a divisor from being 0.

An output matrix $X_{output}$ of the Transformer attention mechanism module is calculated through a layer normalization operation and $F_{FN}(X')$:

$$\begin{cases} X' & = L_N(M_{ultihead}(X)) + X \\ X_{output} & = L_N(F_{FN}(X')) + X' \end{cases} \tag{12}$$

$L_N$ represents the layer normalization operation.

To further implement the foregoing technical solution, the downstream graph classification task part is specifically as follows:

$$\begin{cases} r_{ix} & = \dfrac{1}{N_i}\sum_{p=1}^{N_i} x_p \\ r_{ie} & = \dfrac{1}{M_i}\sum_{q=1}^{M_i} e_q \\ T_i & = \begin{bmatrix} r_{ix} \\ r_{ie} \end{bmatrix} \end{cases} \tag{13}$$

$N_i$ and $M_i$ respectively represent quantities of nodes and edges of a graph $T_i$. $T_i$ is an $i^{th}$ graph representation in the data set. $r_{ix}$ and $r_{ie}$ respectively represent node and edge feature information read from the graph $T_i$. p represents a $p^{th}$ node. q represents a $q^{th}$ edge. A loss function of the model is as follows:

$$Loss = -\frac{1}{N}\sum_{i=1}^{N}\sum_{e=1}^{E} y_{i,e} \log\,(p_{i,e}) \tag{14}$$

N represents a quantity of samples. E represents a quantity of classes. $y_{i,e}$ represents a true label of the $e^{th}$ class of the $i^{th}$ sample. $p_{i,e}$ represents a probability predicted by the model for the $e^{th}$ class of the $i^{th}$ sample.

It should be noted that:

In this embodiment, an upstream network consists of 10 Graph Transformer layers. A structure of each layer is shown in FIG. 1. In the figure, sum represents a summation operation. BN represents a batch normalization operation. The feedforward neural network has 2 hidden layers. The downstream graph classification task part is divided into two steps: First, the node feature and edge feature information are read through averaging, and the unified graph representation is obtained through concatenating, as shown by formula 13. Then, the probabilities that $T_i$ belongs to each class are calculated through softmax.

The data set is divided into a training set, a test set, and a validation set based on a ratio of 8:1:1. Each edge of the graph is numbered. The number of the edge at which the high-impedance ground fault occurs is used as a label of the graph. Training is performed through a multi-class cross-entropy loss function, as shown by formula 14. Finally, the model is trained offline through an AdamW optimization algorithm, and the trained model is saved.

To further implement the foregoing technical solution, S4 specifically includes:

The Graph Transformer model trained offline is called. Continuous wavelet transform is performed on a to-be-detected fault traveling wave sample to obtain traveling wave full waveform feature information. A graph structure is established for a to-be-detected power distribution network to obtain node position and structure encoding information. The traveling wave full waveform feature information, the node position and the structure encoding information are concatenated to obtain a corresponding node feature. The obtained node feature and the edge feature are input into the graph structure to establish the graph sample data set corresponding to the to-be-detected fault traveling wave sample. The graph sample data set is input into the trained Graph Transformer model for classification. A high-impedance ground fault position is determined based on a class of the graph.

In the present disclosure, time-frequency processing is performed on the fault traveling wave data within the selected time window through continuous wavelet transform, to obtain the traveling wave full waveform containing rich fault feature information. This effectively avoids a problem that a conventional steady-state method is difficult to use due to a system operation mode and a high transition resistance, and resolves a problem that a traveling wave method based on transient information depends on high-precision wave head information. In addition, abstract features are extracted from the full waveform through the autoencoder, to reduce data dimensions and data storage and calculation costs. The proposed Graph Transformer high-impedance ground fault locating model combining the graph neural network with the Transformer global attention mechanism implements fault locating by mining an association relationship between time-frequency fault features of the full waveform, network topology information, and the fault position, to improve adaptability of the method to topology changes. A coding scheme based on graph random walk and graph Laplace transform is used to enhance the model's ability to express graph structure and node position information from three perspectives: local, global, and relative. Finally, the fault position is determined based on a graph-level classification task, to avoid a limitation of a conventional node-level classification task and effectively utilize fault information of all measurement points.

Figure 3:
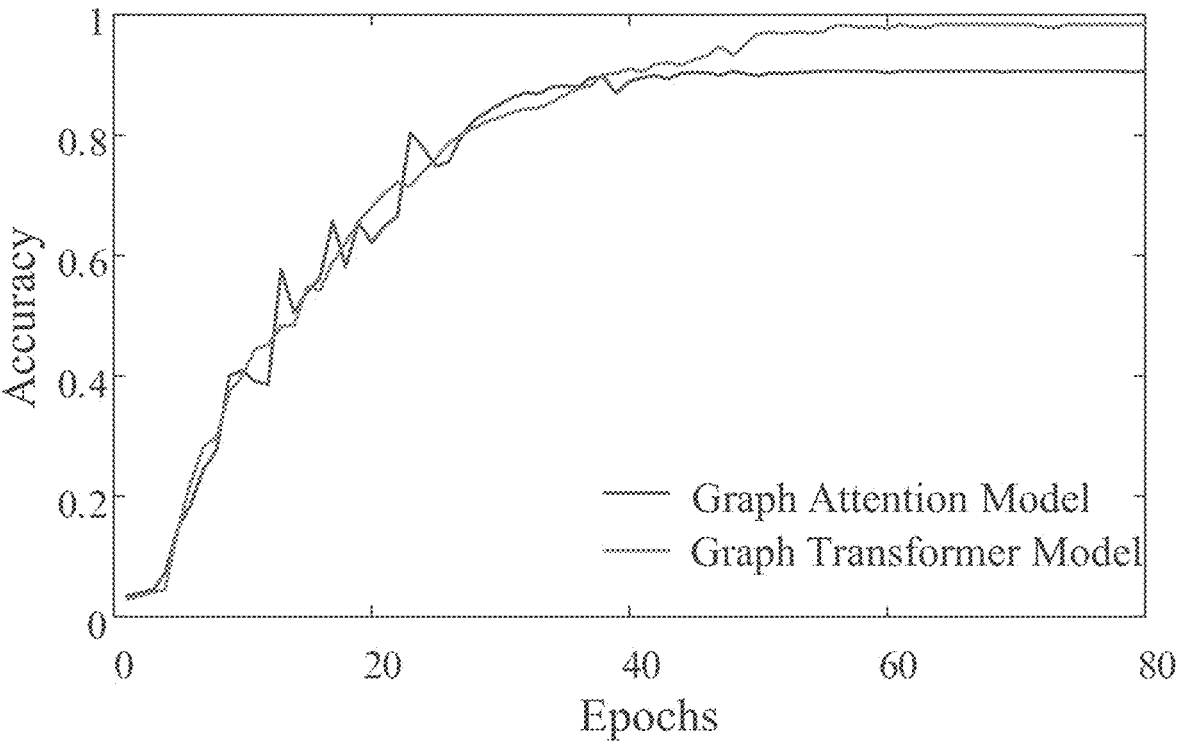
FIG. 3 is a line graph of comparison results according to an embodiment of the present disclosure.

The present disclosure is further described below through a simulation experiment:

In a data set containing 10 topologies, 9 of them are used as a training set and a validation set, and the other is used as a test set. An accuracy comparison between a graph attention neural network and a Graph Transformer network model for the test set is shown in FIG. 3. It can be learned from FIG. 3 that accuracy of a graph attention model for untrained topology data is kept at approximately 0.88, and accuracy of the Graph Transformer network model proposed in the present disclosure is kept at approximately 0.98, which is improved by nearly 10% in comparison with the graph attention model. Therefore, the Graph Transformer network model proposed in the present disclosure has better adaptability to untrained topology data samples.

Figure 4:
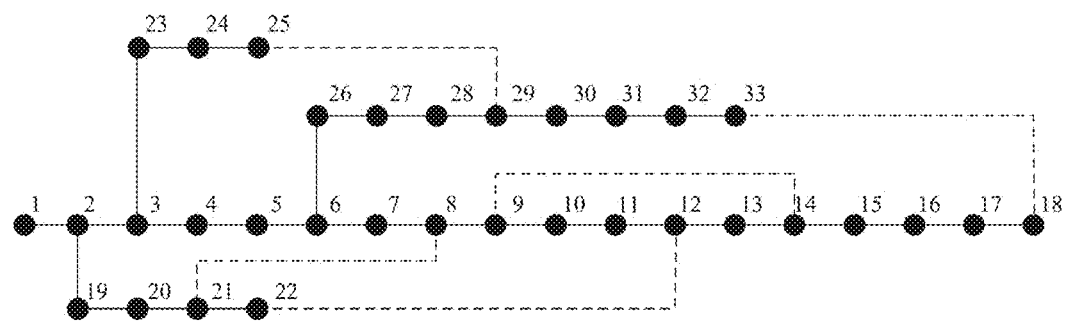
FIG. 4 is a schematic diagram of an IEEE33 node topology network according to an embodiment of the present disclosure.

For example, in an IEEE33 node network shown in FIG. 4, node 1 is connected to a primary grid substation, and nodes 18, 22, 25, and 33 are connected to distributed power supplies. Dashed lines between nodes 8 and 21, 9 and 14, 12 and 22, 18 and 33, and 25 and 29 represent switchable power distribution lines that can be connected or disconnected as needed. Traveling wave measurement apparatuses are mounted at nodes 3, 6, 9, 12, 15, 20, and 29 with a sampling rate of 1 MHz.

The following 5 topologies are considered: (1) Normal operation topology: The power distribution lines between the nodes 8 and 21, 9 and 14, 12 and 22, 18 and 33, and 25 and 29 are disconnected, and power distribution lines between the other nodes are normally connected. (2) Fault reconstruction topologies: On the basis of the normal operation topology, power distribution lines between nodes 5 and 6, 9 and 10, 3 and 23, and 2 and 19 are disconnected, to obtain 4 fault reconstruction topologies.

Figure 5:
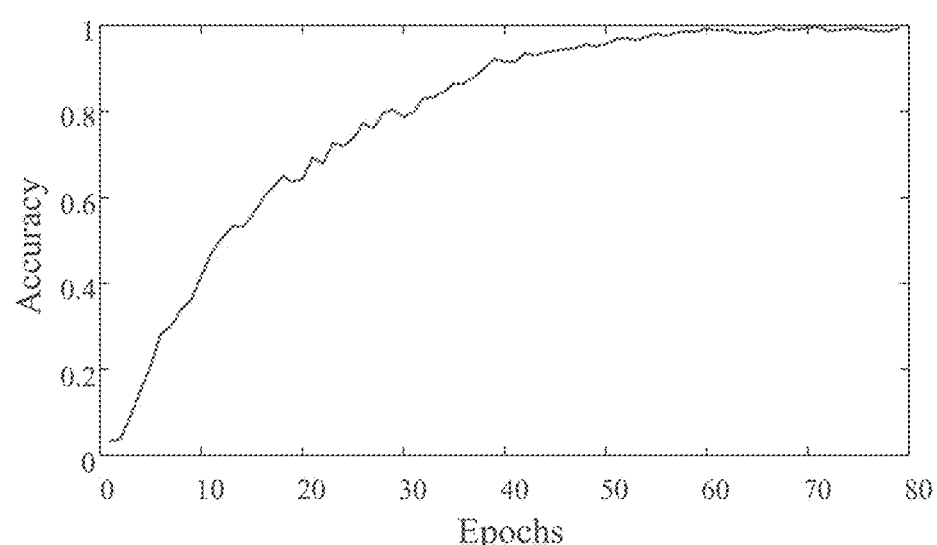
FIG. 5 is a line graph of results of detecting known topology data according to an embodiment of the present disclosure.
Figure 6:
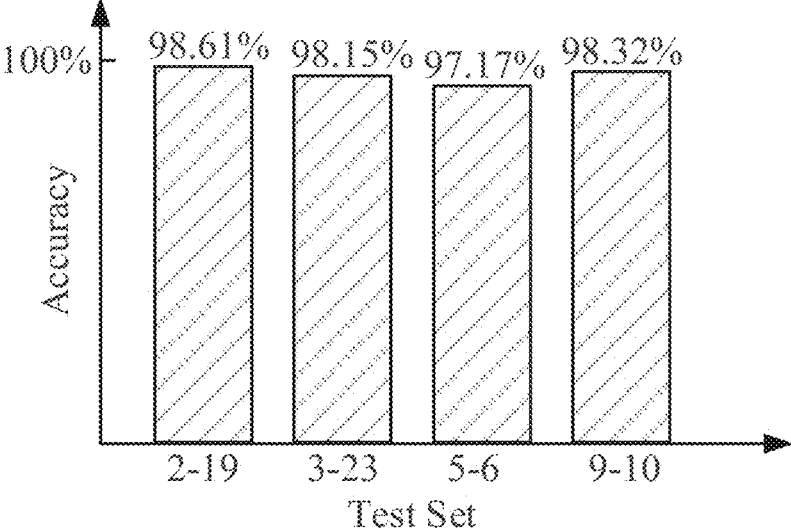
FIG. 6 is a bar graph of results of detecting unknown topology data according to an embodiment of the present disclosure.

A quantity of graph random walk steps m is set to 16. A weight attenuation parameter in an AdamW optimization algorithm is set to 0.00001. A learning rate is set to 0.0005. When all topology data is known, that is, all topology data is randomly divided into a training set, a validation set, and a test set based on a ratio of 8:1:1, an accuracy curve of the Graph Transformer network model in detecting test set data is shown in FIG. 5. After 40 iterations, locating accuracy is stable at more than 99%. When an unknown topology is detected, that is, topology data to be detected in fault reconstruction is put into the test set and the other data is put into the training set and validation set, a detection result is shown in FIG. 6. Locating accuracy is more than 97%.

The foregoing embodiments are merely intended to explain the technical solutions of the present application, rather than to limit the present application. Although the present application is described in detail with reference to the foregoing embodiments, those of ordinary skill in the art should understand that they can still modify the technical solutions described in the foregoing embodiments or make equivalent substitutions on some technical features therein without departing from the spirit and scope of the technical solutions. However, these modifications or substitutions should fall within the protection scope of the present application.

The invention claimed is:

1. A method for locating a high-impedance ground fault of a smart distribution network with topology change adaptation, comprising the following steps:

S1: measuring, by measurement apparatuses, a traveling wave to acquire a fault traveling wave sample within a specified time window after a fault occurs, and performing continuous wavelet transform on the fault traveling wave sample to obtain traveling wave full waveform feature information, wherein a plurality of nodes, corresponding to busbars or feeders, are switchably connected as a tree graph structure and each of said measurement apparatuses are disposed at a respective busbar or feeder denoted by a respective node of the plurality of nodes that is connected to or is switchably connected to at least three other busbars or feeders denoted by at least three other respective nodes of the plurality of nodes;

S2: establishing a graph structure of a power distribution network with the busbars or feeders as the plurality of nodes and power distribution lines between the busbars or the feeders as edges based on a topology of the power distribution network, obtaining a corresponding adjacency matrix, and obtaining node position and structure information in the graph structure through graph random walk and graph Laplace transform; and concatenating the node position, the structure information and the traveling wave full waveform feature information to obtain a node feature, and inputting the node feature and an edge feature into the graph structure to establish a graph sample data set;

wherein S2 comprises:

obtaining an adjacency matrix A and a degree matrix D of a graph, and calculating a random walk matrix M:

$$M = D^{-1}A \qquad (2)$$

wherein each element $M_{ij}$ of the random walk matrix M represents a probability of one step from a node i to a node j in a simple random walk;

summing non-diagonal elements of an m-step random walk matrix to obtain $w_m$:

$$w_m = \sum_i (D^{-1}A)^m - \overline{\overline{w}}_m \qquad (3)$$

wherein $\overline{\overline{w}}_m$ represents obtaining a diagonal of the m-step random walk matrix:

$$\overline{\overline{w}}_m = \text{diag}((D^{-1}A)^m) \qquad (4)$$

$w_m$ and $\overline{\overline{w}}_m$ contain local position and structure information of the node i, and a value of m is selected based on a topology size of the graph;

calculating a Laplace matrix $L_{sym}$ of the graph based on the adjacency matrix A and the degree matrix D:

$$L_{sym} = I - D^{-\frac{1}{2}} A D^{-\frac{1}{2}} \qquad (5)$$

wherein I is an identity matrix;

calculating an eigenvalue $\lambda_k$ of $L_{sym}$ and a corresponding eigenvector $\phi_k$; obtaining non-zero eigenvalues and concatenating eigenvectors corresponding to the non-zero eigenvalues into a matrix H, wherein each row of the matrix H corresponds to a representation of a node in an eigenspace; and capturing global position information of the node;

calculating a gradient $\nabla\phi_k$ of the eigenvector $\phi_k$ as relative position information of the node; and using, as relative structure information, a Boolean value indicating whether two nodes belong to a same substructure, wherein a cosine similarity of traveling wave full waveform feature information of the two nodes is calculated to determine whether the two nodes belong to the same substructure, and when the cosine similarity is less than a preset threshold, the Boolean value is False, or when the cosine similarity is greater than the preset threshold, the Boolean value is True;

performing batch normalization on $w_m$, $\overline{w}_m$, $\phi_k$, $\nabla\phi_k$, and $\lambda_k$, and concatenating the traveling wave full waveform feature information, wherein Z denotes the traveling wave full waveform feature information, $w_m$, $\overline{w}_m$, $\phi_k$, and $\lambda_k$ to obtain a node feature x containing the node position, the structure information and the traveling wave full waveform feature information;

concatenating $\nabla\phi_k$, the relative structure information, and edge feature information to obtain an edge feature e; and inputting the node feature and the edge feature into the graph to establish the graph sample data set; and setting a traveling wave full waveform feature of a corresponding busbar of the busbars or a corresponding feeder of the feeders without a measurement device to 0, and concatenating $w_m$, $\overline{w}_m$, $\phi_k$, and $\lambda_k$ corresponding to a case of no measurement device to obtain a node feature of the feeder without the measurement device;

S3: in an offline stage, constructing a Graph Transformer model, and training the Graph Transformer model by locating the high-impedance ground fault through a graph classification task, to obtain a trained Graph Transformer model; and S4: in an online stage, calling the trained Graph Transformer model to locate a fault in to-be-detected sample data.

2. The method for locating the high-impedance ground fault of the smart distribution network with topology change adaptation according to claim 1, wherein the performing continuous wavelet transform to obtain the traveling wave full waveform feature information comprises:

performing continuous wavelet transform on acquired traveling wave data to draw a time-frequency waveform of a voltage traveling wave signal, wherein the time-frequency waveform is a traveling wave full waveform;

inputting the traveling wave full waveform into an auto-encoder neural network, wherein a model of the auto-encoder neural network is as follows:

$$\begin{cases} Z = \sigma(W_1 X + b_1) & (1) \\ \hat{X} = \sigma(W_2 Z + b_2) \\ L_{MSE} = \dfrac{1}{ab}\sum_{i=1}^{a}\sum_{j=1}^{b}\left(X_{ij} - \hat{X}_{ij}\right)^2 \end{cases}$$

wherein $\sigma$ represents a sigmoid activation function, X represents an input sample, $\hat{X}$ represents a reconstructed sample, Z represents hidden layer output, $L_{MSE}$ represents a mean square error loss function, $W_1$ and $W_2$ are weight matrices, $b_1$ and $b_2$ are bias terms, X and $\hat{X}$ have dimensions of a×b, and $X_{ij}$ and $\hat{X}_{ij}$ represent elements in an $i^{th}$ row and a $j^{th}$ column of matrices; and extracting hidden layer information Z as the traveling wave full waveform feature information.

3. The method for locating the high-impedance ground fault of the smart distribution network with topology change adaptation according to claim 1, wherein the constructing the Graph Transformer model in S3 comprises:

constructing an upstream information processing part and a downstream graph classification task part as the Graph Transformer model;

wherein the upstream information processing part comprises f Graph Transformer layers connected in sequence, and each of the f Graph Transformer layers comprises a graph neural network with a residual gated graph convolutional network layer as a main structure and a Transformer attention mechanism module; and the downstream graph classification task part is used to read node feature and edge feature information through averaging, a unified graph representation $T_i$ is obtained through concatenating, probabilities that the unified graph representation $T_i$ belongs to each class are calculated, a sum of the probabilities is 1, and the class with the highest probability is output as the class of the unified graph representation $T_i$.

4. The method for locating the high-impedance ground fault of the smart distribution network with topology change adaptation according to claim 3, wherein the graph neural network with the residual gated graph convolutional network layer as the main structure comprises:

using, as input of the graph neural network at an $(l+1)^{th}$ layer, a node feature and an edge feature output by an $l^{th}$ Graph Transformer layer:

$$\begin{cases} x_i^{l+1} = ReLU\left(BN\left(U^l x_i^l + \sum_{j\to i}\eta_{ij}\odot V^l x_j^l M_{ultihead}(x_j^l)\right)\right) + M_{ultihead}(x_i^l)x_i^l & (6) \\ e_{ij}^{l+1} = ReLU\left(BN(\overline{\eta}_{ij})\right) + e_{ij}^l \end{cases}$$

$$\begin{cases} \eta_{ij} = \sigma\left(A^l x_i^l + B^l x_j^l\right) & (7) \\ \overline{\eta}_{ij} = X^l x_i^l + Y^l x_j^l + Z^l e_{ij}^l \end{cases}$$

wherein ReLU represents a rectified linear unit (ReLU) activation function, BN represents batch normalization, $$x_i^l \text{ and } x_i^{l+1}$$

respectively represent node features of the node i at the $l^{th}$ and $(l+1)^{th}$ layers, $$e_{ij}^l \text{ and } e_{ij}^{l+1}$$

respectively represent edge features between the node i and the node j at the $l^{th}$ and $(l+1)^{th}$ layers, $$M_{ultihead}\left(x_j^l\right)$$ represents an attention weight of the node j to the node i, $$M_{ultihead}\left(x_i^l\right)$$ represents a self-attention weight of the node i,

$$M_{ultihead}\left(x_j^l\right) \text{ and } M_{ultihead}\left(x_i^l\right)$$

are calculated by the Transformer attention mechanism module, $U^l$ and $V^l$ are weight parameters to be learned at the $l^{th}$ layer, $\odot$ represents a Hadamard product operation, $j \rightarrow i$ represents the adjacent node j of the node i, $\eta_{ij}$ and $\overline{\eta}_{ij}$ are gating mechanisms for updating the node feature and the edge feature, to control feature propagation among the nodes and edges, $\sigma$ represents a sigmoid activation function, $$x_j^l$$ represents a node feature of the node j, and $X^l$, $Y^l$, $Z^l$, $A^l$, and $B^l$ are weight parameters to be learned at the $l^{th}$ layer.

5. The method for locating the high-impedance ground fault of the smart distribution network with topology change adaptation according to claim 3, wherein the Transformer attention mechanism module comprises a multi-head self-attention structure and a feedforward neural network;

in the multi-head self-attention structure, with each node feature $x_i$ as a row, all node features are sequentially arranged to form an input eigenmatrix X, and three different linear transformations are performed on X to respectively obtain a query matrix Q, a key matrix K, and a value matrix V:

$$\begin{cases} Q = XW_Q \\ K = XW_K \\ V = XW_V \end{cases}$$ (8)

wherein $W_Q$, $W_K$, and $W_V$ are linear transformation matrices, and elements of the linear transformation matrices are determined through training and learning;

a single-head attention $h_{eadi}$ and a final attention output $M_{ultihead}(X)$ are calculated based on Q, K, and V:

$$\begin{cases} h_{eadi} = Attn(X) = softmax\left(\dfrac{QK^T}{\sqrt{d_K}} + B\right)V \\ M_{ultihead}(X) = C_{oncat}(h_{ead1}, h_{ead2}, \cdots, h_{eadi})W \end{cases}$$ (9)

wherein $d_K$ represents a quantity of columns in the matri- ces Q and K, $C_{oncat}(\cdot)$ represents a concatenation func- tion, W is a weight matrix obtained through training and learning, and B is a bias term matrix obtained through learning;

after calculation through formula (9), residual connection and layer normalization are performed on output of the multi-head self-attention structure to output X', and X' is input into the feedforward neural network;

the feedforward neural network comprises two fully con- nected layers, each of the two fully connected layers linearly maps an input vector, a hidden layer in between the two fully connected layers is activated through an ReLU function, and the feedforward neural network is as follows:

$$F_{FN}(X') = \max(0, X'W_3 + b_3)W_4 + b_4$$ (10)

wherein $W_3$ and $W_4$ are weight matrices, and $b_3$ and $b_4$ are bias terms;

residual connection and layer normalization are per- formed on output of the feedforward neural network, and the layer normalization comprises:

$$\begin{cases} \mu = \dfrac{1}{T}\sum_{i=1}^{T} X_i \\ S = \sqrt{\dfrac{1}{T}\sum_{j=1}^{T}(X_i - \mu)^2} \\ L_N(x) = \alpha\dfrac{x - \mu}{\sqrt{\sigma^2 + \varepsilon}} + \beta \end{cases}$$ (11)

wherein T represents a dimension of an eigenvector $X_i$; $\mu$ represents a mean; S represents a standard deviation; $X_i$ represents an $i^{th}$ dimension of the input eigenvector; $\alpha$ and $\beta$ are learnable model parameters updated through back propagation; and $\varepsilon$ is a decimal for preventing a divisor from being 0; and an output matrix $X_{output}$ of the Transformer attention mechanism module is calculated through a layer nor- malization operation and $F_{FN}(X')$:

$$\begin{cases} X' = L_N(M_{ultihead}(X)) + X \\ X_{output} = L_N(F_{FN}(X')) + X' \end{cases}$$ (12)

wherein $L_N$ represents the layer normalization operation.

6. The method for locating the high-impedance ground fault of the smart distribution network with topology change adaptation according to claim 3, wherein the downstream graph classification task part is implemented as follows:

$$\begin{cases} r_{ix} = \dfrac{1}{N_i}\sum_{p=1}^{N_i} x_p \\ r_{ie} = \dfrac{1}{M_i}\sum_{q=1}^{M_i} e_q \\ T_i = \begin{bmatrix} r_{ix} \\ r_{ie} \end{bmatrix} \end{cases}$$ (13)

wherein $N_i$ and $M_i$ respectively represent quantities of nodes and edges of a graph $T_i$, $T_i$ is an $i^{th}$ graph representation in the graph sample data set, $r_{ix}$ and $r_{ie}$ respectively represent node and edge feature informa- tion read from the graph $T_i$, p represents a $p^{th}$ node, and q represents a $q^{th}$ edge; and a loss function of a model is as follows:

$$\text{Loss} = -\frac{1}{N}\sum_{i=1}^{N}\sum_{e=1}^{E} y_{i,e}\,\log\,(p_{i,e}) \quad\quad (14)$$

wherein N represents a quantity of samples, E represents a quantity of classes, $y_{i,e}$ represents a true label of an $e^{th}$ class of an $i^{th}$ sample, and $p_{i,e}$ represents a probability predicted by the model for the $e^{th}$ class of the $i^{th}$ sample.

7. The method for locating the high-impedance ground fault of the smart distribution network with topology change adaptation according to claim 1, wherein S4 comprises:

calling the Graph Transformer model trained offline, performing continuous wavelet transform on a to-be-detected fault traveling wave sample to obtain traveling wave full waveform feature information, establishing a graph structure for a to-be-detected power distribution network to obtain node position and structure information, concatenating the traveling wave full waveform feature information, the node position and the structure information to obtain the node feature, inputting the node feature and the edge feature into the graph structure to establish the graph sample data set corresponding to the to-be-detected fault traveling wave sample, inputting the graph sample data set into the trained Graph Transformer model for classification, and determining a high-impedance ground fault position based on a class of the graph.

* * * * *